United States Patent
Campbell

(10) Patent No.: US 10,797,466 B2
(45) Date of Patent: *Oct. 6, 2020

(54) CO2 LASER

(71) Applicant: Robert Neil Campbell, Corrales, NM (US)

(72) Inventor: Robert Neil Campbell, Corrales, NM (US)

(*) Notice: Subject to any disclaimer, the term of this patent is extended or adjusted under 35 U.S.C. 154(b) by 0 days.

This patent is subject to a terminal disclaimer.

(21) Appl. No.: 15/694,752

(22) Filed: Sep. 1, 2017

(65) Prior Publication Data

US 2018/0019567 A1 Jan. 18, 2018

Related U.S. Application Data

(63) Continuation of application No. 13/135,208, filed on Jun. 29, 2011, now abandoned.

(51) Int. Cl.
  *H01S 3/0943* (2006.01)
  *H01S 3/16* (2006.01)
  *H01S 3/223* (2006.01)
  *H01S 3/067* (2006.01)
  *H01S 3/22* (2006.01)
  (Continued)

(52) U.S. Cl.
  CPC .......... *H01S 3/1616* (2013.01); *H01S 3/1643* (2013.01); *H01S 3/2232* (2013.01); *H01S 3/005* (2013.01); *H01S 3/06754* (2013.01); *H01S 3/0941* (2013.01); *H01S 3/0943* (2013.01); *H01S 3/094096* (2013.01); *H01S 3/10084* (2013.01); *H01S 3/13* (2013.01); *H01S 3/22* (2013.01); *H01S 3/223* (2013.01);
  (Continued)

(58) Field of Classification Search
  CPC .... H01S 3/1616; H01S 3/1643; H01S 3/2232; H01S 3/06754; H01S 3/10084; H01S 3/2207; H01S 3/223; H01S 3/13; H01S 3/0943; H01S 3/22; H01S 3/0005; H01S 3/094096; H01S 3/2308; H01S 3/2391; H01S 3/0941; H01S 5/4012
  See application file for complete search history.

(56) References Cited

U.S. PATENT DOCUMENTS

2005/0111509 A1* 5/2005 Brasseur .................. H01S 3/30
  372/55

* cited by examiner

*Primary Examiner* — Tod T Van Roy
*Assistant Examiner* — Delma R Fordé

(57) ABSTRACT

Efficient laser diode excited Thulium (Tm) doped solid state systems, directly matched to a combination band pump transition of Carbon Dioxide ($CO_2$), have matured to the point that utilization of such in combination with $CO_2$ admits effectively a laser diode pumped $CO_2$ laser. The laser diode excited Tm solid state pump permits Continuous Wave (CW) or pulsed energy application. Appropriate optical pumping admits catalyzer free near indefinite gas lifetime courtesy of the absence of significant discharge driven dissociation and contamination. As a direct consequence of the preceding arbitrary multi isotopologue $CO_2$, symmetric and asymmetric, gas mixes may be utilized without significant degradation or departure from initial mix specifications. This would admit, at raised pressure, a system continuously tunable from approximately 9 μm to approximately 11.5 μm, or sub picosecond amplification. This method offers advantages in regards scalability, pulse energy and power, over alternative non linear conversion techniques in access to this spectral region.

14 Claims, 2 Drawing Sheets

(51) Int. Cl.
   *H01S 3/00*     (2006.01)
   *H01S 3/10*     (2006.01)
   *H01S 3/13*     (2006.01)
   *H01S 5/40*     (2006.01)
   *H01S 3/094*    (2006.01)
   *H01S 3/0941*   (2006.01)
   *H01S 3/23*     (2006.01)

(52) U.S. Cl.
   CPC ........... *H01S 3/2207* (2013.01); *H01S 3/2308* (2013.01); *H01S 3/2391* (2013.01); *H01S 5/4012* (2013.01)

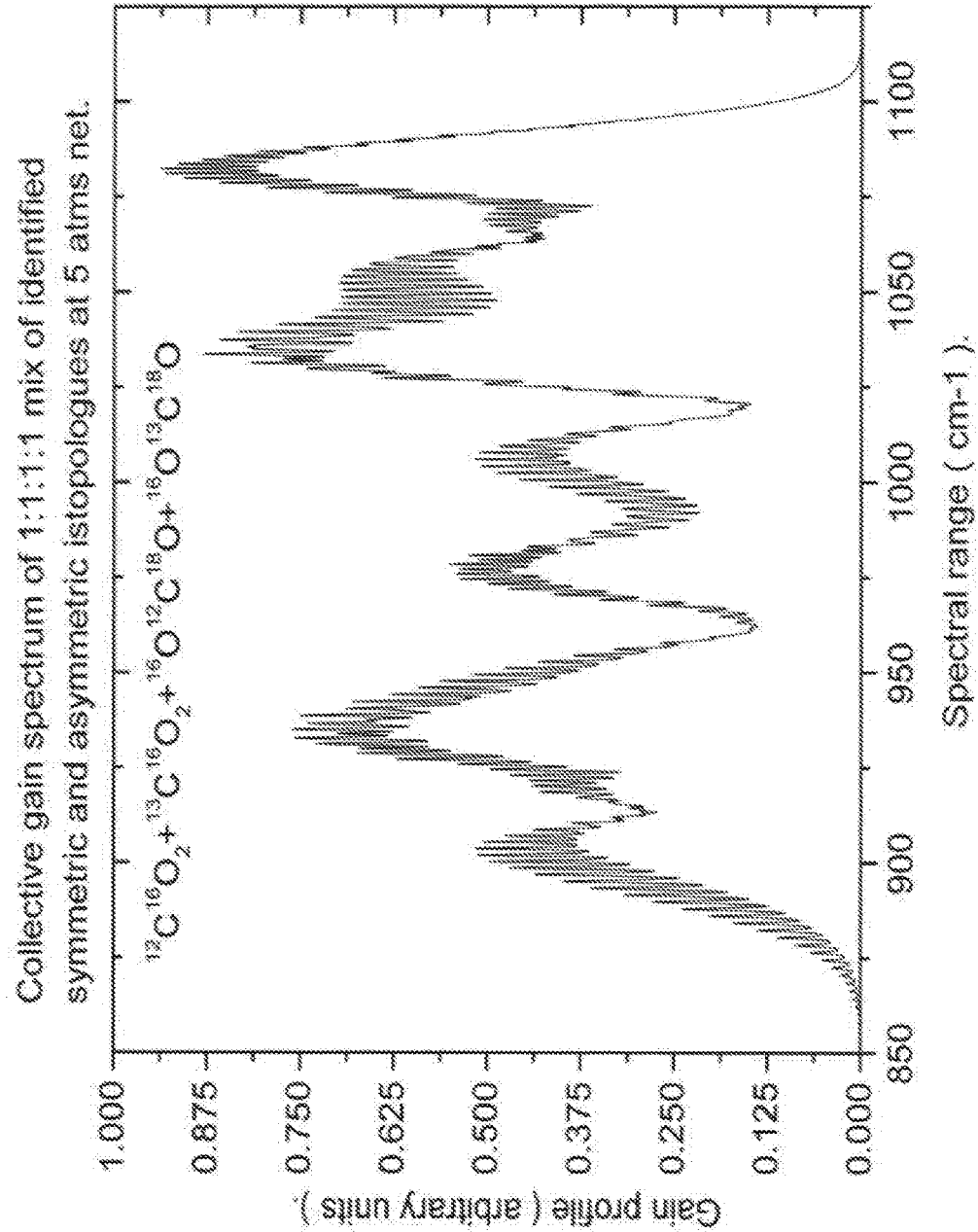

CO2 LASER

CROSS REFERENCE TO RELATED APPLICATIONS

This application is a Continuation of application Ser. No. 13/135,208 filed on Jun. 29, 2011.

BACKGROUND OF INVENTION

1. Field of the Invention

This invention relates to high power, infra-red, optically pumped $CO_2$ lasers.

2. Description of the Prior Art

U.S. Pat. No. 3,810,042 (Tunable Infrared Molecular Laser Optically Pumped by a Hydrogen Bromide Laser) describes lasers that are disclosed, wherein there are laser configurations in which a high pressure molecular medium such as compressed CO2, liquid CO2 or solid CO2 is pumped by a hydrogen-bromide molecular laser. The hydrogen-bromide laser, when transversely excited, can provide high pump powers between 4.0 and 4.6 micrometers wavelength. This wavelength range is desirable for pumping molecules having a linear three-atomic skeletal, including those molecules which are simple linear three-atomic molecules. An example of a more complicated molecule having a linear three-atomic skeletal is CH2CO. The active medium has a spectrum of vibrational-rotational emission lines that merge into a continuum that is suitable for mode-locked pulsing or tunable operation.

The primary deficiency is the use of a Hydrogen Bromide (HBr) laser molecular pump which, in practice, is not suitable. Chemical lasers, though in general efficient, require the handling of exhaust product and precursor fuel and oxidizer. Even if purely cold-reaction discharge initiated by dissociation of a halogen donor, these are then typically inefficient and still require product gas handling. In addition, HBr is a multiline molecular laser with a defined emission line structure, thus at approximately atmospheric pressure or less, the Carbon Dioxide ($CO_2$) attributable absorption line structure is only in sporadic proximity to a limited number of HBr lines, both $CO_2$ and HBr of limited bandwidth, and thus efficient pump utilization is not easily achieved under such conditions. That is to say, HBr is not continuously tunable within a broad band, thus as a pump for $CO_2$ it offers, at low to moderate pressure, no more than limited line matching. In addition, the 1→0 vibrational transition of HBr occupies the spectral range 2400 $cm^{-1}$ to 2700 $cm^{-1}$, which presents essentially no spectral overlap with the $00^00 \to 00^01$ $CO_2$ transition being pumped. The forgoing has direct implications in regards baseline useful emission, for any isotopologue of $CO_2$, from HBr, and thus global system efficiency whether or not $CO_2$ is at pressure. Further deficiencies, common to this cited prior art and those cited below are presented in the final paragraphs of this section. By convention the vibrational band of $CO_2$ is designated by a numerical term of the form ab$^c$d, where 'a', 'b' and 'd' are the $v_1$, $v_2$ and $v_3$ vibrational quantum numbers respectively and 'c' is the angular momentum quantum number. The symbol, →, denotes a transition, and can be read as 'to'. Isotopologues are by standard definition molecules that differ only in their isotopic composition. The terminology 'isotopologue(s)' is invoked to designate either a singular or multiplicity of isotopologue choices.

U.S. Pat. No. 3,860,884 (Optically Pumped $N_2O$ or similar gas mixed with Energy Transferring $CO_2$) describes a powerful excitation technique for a mixture of molecular gases in which a combination of optical pumping and resonant energy transfer is used. An optically-pumped $N_2O$ laser pumped at 4.3 μm by HBr laser is "seeded" with a minor portion of $CO_2$, which absorbs the pumping radiation and transfers it by vibration-vibration energy transfer to invert the populations of the $00^01$ and $10^0$ levels of the $N_2O$. In this laser oscillations have been achieved at 10.5 μm at total pressure up to 42 atmospheres, which is more than an order of magnitude greater than feasible in an optically-pumped $N_2O$ laser without $CO_2$. The advantages of broad tunability and short pulse width are obtainable. In addition, a rare isotope $CO_2$ laser employs $^{13}C^{16}O_2$ to comprise at least 90 percent and possibly as much as 97 percent of the gas mixture, together with as little as 3 percent of ordinary $CO_2$ ($^{12}C^{16}O_2$). Only the ordinary $CO_2$ absorbs a significant portion of the pumping radiation directly; but significant energy transfer occurs by collision from the ordinary $CO_2$ to the $^{13}C^{16}O_2$. Laser oscillation is thereby obtainable between about 9 μm and 11 μm for a total pressure exceeding about 40 atmospheres.

The primary deficiency is, as per the prior cited patent, the use of a Hydrogen Bromide (HBr) laser pump which, in practice, is not suitable. Chemical lasers, though in general efficient, require the handling of exhaust product and precursor fuel and oxidizer. Even if purely cold-reaction discharge initiated by dissociation of a halogen donor, these are then typically inefficient and still require product gas handling. In addition, the 1→0 transition of HBr occupies the spectral range 2400 $cm^{-1}$ to 2700 $cm^{-1}$, which presents essentially no spectral overlap with the $00^00 \to 00^01$ $CO_2$ transition being pumped, for any isotopologue of $CO_2$. The forgoing has direct implications in regards baseline useful emission from HBr, and thus global system efficiency whether or not $CO_2$ is at pressure. Further deficiencies, common to this cited prior art and those cited below are presented in the final paragraphs of this section.

U.S. Pat. No. 4,145,668 (Optically Resonance Pumped Transfer Laser with High Multiline Photon to Single Line Photon conversion efficiency) describes lasers that are disclosed, wherein trapped multiline laser radiation from a DF laser is employed to pump a DF+$CO_2$ working gas mixture within the optical resonator for the DF laser. The multiline pumping energy is resonantly absorbed by the DF component of the working gas mixture and collisionally transferred to upper energy levels of lasing transitions in $CO_2$. A narrow-band optical resonator disposed about the working gas interaction region with the pumping radiation and tuned to a desired $CO_2$ transition enables a single line laser output to be obtained on the desired transition.

The primary deficiency is, as per the prior cited patents, the use of a chemical laser pump which, in practice, is not suitable. In this case, the specified Deuterium Fluoride (DF) laser pump is not practical. Chemical lasers, though in general efficient, require the handling of exhaust product and precursor fuel and oxidizer. Even if purely cold-reaction discharge initiated by dissociation of a halogen donor, these are then typically inefficient and still require product gas handling. Further deficiencies, common to this cited prior art and those cited below are presented in the final paragraphs of this section.

The article, New Direct Optical Pump Schemes for Multi-atmosphere $CO_2$ and $N_2O$ Lasers [K. Stenersen et al, IEEE Journal of Quantum Electronics, 25(2), 1989, 147-153] describes nine schemes for direct optical pumping of multi-atmosphere $CO_2$ and $N_2O$ lasers at pump wavelengths in the 1.4-3.6-μm region. Most of these wavelengths can be generated by solid-state lasers, which are more attractive pump sources than the chemical lasers (HBr, HF) used previously to pump high-pressure $CO_2$ and $N_2O$ lasers. Including previously studied pump schemes, there are altogether 14 possible pump transitions in $CO_2$ and $N_2O$ in the 1.4-4.5-μm region. Numerical laser simulations are carried out to compare all of these pump schemes. Assuming 10 $J/cm^2$ pump energy in a pulse of 100 ns FWHM, and 5% output coupling as the only resonator loss, the calculated energy conversion efficiencies are in the range of 6-40%. The pump thresholds are in the range of 0.1-3.1 $J/cm^2$.

This article correctly identifies the $00^00 \rightarrow 20^01$ transition as a possible $CO_2$ optical pump path but it is deficient in that related identified solid state ($Co:MgF_2$, Er:YLF) optical pump systems are simply not sensible. At room temperature the $Co:MgF_2$ upper state lifetime is ~35 μs. The tilde symbol ~ follows mathematical convention and denotes approximately throughout this text. Thus $Co:MgF_2$ can only be pumped, at room temperature, by another pulsed laser, perhaps laser diode excited. Global efficiency will diminish for each new laser inserted in the system chain, as will complexity, thus an undesirable concept. To date, Nd:YAG at 1338 nm has been used to pump $Co:MgF_2$, and Nd:YAG on this line is no more than ~24% efficient, and pumped $Co:MgF_2$ was no more than ~35% efficient to yield a net best pump source efficiency of ~8%. Since the primary laser diodes pumping Nd:YAG would be ~55% efficient the optical to electrical efficiency of this pump system would be ~5%. This as opposed to the ~25% or better feasible for the laser diode pumped Tm:YAG (Thulium doped Yttrium Aluminum Garnet) for example. In the case of Er lasers, they simply cannot efficiently get into the correct pump band around ~2 μm for $CO_2$. The article is deficient in that it does not identify the $01^11$ level as a possible, beneficial, metastable level deriving from the identified pump transition. Other deficiencies are presented in the final paragraphs of this section.

The article, Direct Optically Pumped Multiwavelength $CO_2$ Laser [M. I. Buchwald et al, Applied Physics Letters, 29(5), 1976, 300-302] describes an HF laser that was used to directly pump various isotopic forms of $CO_2$. Intense laser emission was observed on numerous lines in the 4.3, 10.6, and 17 μm regions. All observed 4.3 and 17 μm $CO_2$ laser emission lines were assigned. The pressure dependence of lasing spectra and laser pulse temporal features were examined.

This approach is deficient in that optical pumping of $CO_2$ on the $00^00 \rightarrow 10^01$ transition was employed. This required a Hydrogen Fluoride (HF) laser which is not sensible from a practical standpoint. As per the prior cited patents, the use of a chemical laser pump, which in practice, is not suitable. In this case, the specified Hydrogen Fluoride laser pump is not practical. Chemical lasers, though in general efficient, require the handling of exhaust product and precursor fuel and oxidizer. Even if purely cold-reaction discharge initiated by dissociation of a halogen donor, these are then typically inefficient and still require product gas handling. In addition, it is of course a multiline laser and there is only coincidental approximate line matching of some form and the $1 \rightarrow 0$ transition offers no meaningful spectral overlap with the $00^00 \rightarrow 10^01$ pump transition. All of which has direct implications in terms of net efficiency and suitability as a pump for molecular $CO_2$. Further deficiencies, common to this cited prior art and those cited below are presented in the final paragraphs of this section.

The article, Optically Pumped Atmospheric Pressure $CO_2$ Laser [T. Y. Chang et al, Applied Physics Letters, 21, 1972, 19] describes laser action at 10.6 μm that has been obtained in pure $CO_2$ gas at pressures up to 1 atm by optically pumping with the 4.23 μm line of a TEA HBr laser. The potential usefulness of this method for pumping very high density $CO_2$ is discussed.

The primary deficiency is, as per the prior cited patents and article, the use of a Hydrogen Bromide laser pump which, in practice, is not suitable. HBr is a multiline molecular laser with a defined emission line structure, thus at approximately atmospheric pressure or less the $CO_2$ attributable absorption line structure is only in sporadic proximity to a limited number of HBr lines, both $CO_2$ and HBr of limited bandwidth and thus efficient pump utilization is not easily achieved under such conditions. That is to say, HBr is not continuously tunable within a broad band, thus as a pump for $CO_2$ it offers, at low to moderate pressure, no more than limited line matching. In addition, the $1 \rightarrow 0$ transition of HBr occupies the spectral range 2400 $cm^{-1}$ to 2700 $cm^{-1}$, which presents essentially no spectral overlap with the $00^00 \rightarrow 00^01$ $CO_2$ transition being pumped. The forgoing has direct implications in regards baseline useful (for any isotopologue of $CO_2$) emission from HBr, and thus global system efficiency whether or not $CO_2$ is at pressure. Furthermore chemical lasers, though in general efficient, require the handling of exhaust product and precursor fuel and oxidizer. Even if purely cold-reaction discharge initiated by dissociation of a halogen donor, these are then typically inefficient and still require product gas handling. Further deficiencies, common to this cited prior art and those cited below are presented in the final paragraphs of this section.

The article, Optically Pumped $N_2O$ Laser [T. Y. Chang et al, Applied Physics Letters, 22, 1973, 93], describes laser action at 10.8 μm that has been obtained in pure $N_2O$ gas at pressures up to 270 Torr by optically pumping with the 4.465 μm line of a TEA HBr laser. Possible extension of this pumping technique to other linear three-atomic molecules and molecules with a linear three-atomic skeletal is discussed.

The primary deficiency is, as per the prior cited patents and articles, the use of a Hydrogen Bromide laser pump which, in practice, is not suitable. Chemical lasers, though in general efficient, require the handling of exhaust product and precursor fuel and oxidizer. Even if purely cold-reaction discharge initiated by dissociation of a halogen donor, these are then typically inefficient and still require product gas handling. In addition, HBr is a multiline molecular laser with a defined emission line structure, thus at approximately atmospheric pressure or less the $N_2O$ attributable absorption line structure is only in sporadic proximity to a limited number of HBr lines, both $N_2O$ and HBr of limited bandwidth and thus efficient pump utilization is not easily achieved under such conditions. That is to say, HBr is not continuously tunable within a broad band, thus as a pump for $N_2O$ it offers, at low to moderate pressure, no more than limited line matching. In addition, the $1 \rightarrow 0$ transition of HBr occupies the spectral range 2400 $cm^{-1}$ to 2700 $cm^{-1}$, which presents essentially no spectral overlap with the $00^00 \rightarrow 00^01$ $N_2O$ transition being pumped. The forgoing has direct implications in regards baseline useful emission from HBr, and thus global system efficiency whether or not $N_2O$ is at pressure. Further deficiencies, common to this cited prior art and those cited below are presented in the final paragraphs of this section.

The article, Optically Pumped 33 atm $CO_2$ Laser [T. Y. Chang et al, 23, 1973, 370], describes single nanosecond laser pulses at wavelengths near 10 μm that have been obtained by using a pulsed HBr laser to optically pump pure $CO_2$ gas at pressures up to 33 atm in a 1 mm-long optical resonator. At pressures above 17 atm, the laser oscillates on the 10.3 μm R branch rather than on the usual 10.6 μm P branch.

The primary deficiency is, as per the prior cited patents and article, the use of a Hydrogen Bromide laser pump which, in practice, is not suitable. Chemical lasers, though in general efficient, require the handling of exhaust product and precursor fuel and oxidizer. Even if purely cold-reaction discharge initiated by dissociation of a halogen donor, these are then typically inefficient and still require product gas handling. In addition, the 1→0 transition of HBr occupies the spectral range 2400 $cm^{-1}$ to 2700 $cm^{-1}$, which presents essentially no spectral overlap with the $00^00\to 00^01$ $CO_2$ transition being pumped. The forgoing has direct implications in regards baseline useful (for any isotopologue of $CO_2$) emission from HBr, and thus global system efficiency whether or not $CO_2$ is at pressure. Further deficiencies, common to this cited prior art and those cited below are presented in the final paragraphs of this section.

The article, Optically Pumped 16 μm Laser [R. M. Osgood, Applied Physics Letters, 28, 1976, 342] describes a potentially useful 16 μm $CO_2$ laser, oscillating on the [$10^00$, $02^00$] to $01^10$ transition, is described. The v=1→v=0 (v is the vibrational level quantum number designator) lines from an HBr chemical laser were used to pump a low-pressure mixture of HBr and $CO_2$ gases. Vibrational energy transfer from HBr followed by a 9.6 μm stimulating pulse populated the $CO_2$ [$10^00,02^00$] level.

The primary deficiency is, as per the prior cited patents and article, the use of a Hydrogen Bromide laser pump which, in practice, is not suitable. Chemical lasers, though in general efficient, require the handling of exhaust product and precursor fuel and oxidizer. Even if purely cold-reaction discharge initiated by dissociation of a halogen donor, these are then typically inefficient and still require product gas handling. In addition, HBr is a multiline molecular laser with a defined emission line structure, thus at approximately atmospheric pressure or less the $CO_2$ attributable absorption line structure is only in sporadic proximity to a limited number of HBr lines, both $CO_2$ and HBr of limited bandwidth and thus efficient pump utilization is not easily achieved under such conditions. That is to say, HBr is not continuously tunable within a broad band, thus as a pump for $CO_2$ it offers, at low to moderate pressure, no more than limited line matching. In addition, the 1→0 transition of HBr occupies the spectral range 2400 $cm^{-1}$ to 2700 $cm^{-1}$, which presents essentially no spectral overlap with the $00^00\to 00^01$ $CO_2$ transition being pumped. The forgoing has direct implications in regards baseline useful (for any isotopologue of $CO_2$) emission from HBr, and thus global system efficiency whether or not $CO_2$ is at pressure. Further deficiencies, common to this cited prior art and those cited below are presented in the final paragraphs of this section.

The preceding approaches are all deficient relative to that of this proposal by virtue of this proposal's specific utilization of laser diode pumped Tm solid state as the source for the direct optical pumping of $CO_2$, and derivative aspects thereof. Continuous tuning has been demonstrated from ~1.74 μm through ~2.017 μm, which well matches the $CO_2$ pump transition ($00^00\to 20^01$) range of ~1.949 μm to 2.035 μm inclusive of all isotopologues. Laser diode pumped Tm solid state systems have demonstrated impressive performance. Raised pressure operation of said $CO_2$ systems would render locking of Tm system spectral output on pressure broadened $00^00\to 20^01$ transition technically simple. It has been argued that use of optical pumping of molecular transitions necessarily results in reduced performance from the pump source system because of need to narrow the line width of these sources to match the line width of the molecular transition concerned. This in turn depressing global system performance. In the case of high pressure $CO_2$ the pump transition, $00^00\to 20^01$, coalesces into a band of width ~1000 GHz to 2000 GHz (or 12 to 24 nm) per isotopologue courtesy of pressure broadening at 5 atms for example. Thus in this case this objection does not apply. Secondly, at high dopant level concentrations cross relaxation in Tm media is rapid and the pump pulse event duration required is typically in the region of ~200 ns full width half maximum which is substantial, and finally it is possible to amplify several spectrally separated wavelength components in a medium which has inhomogeneous line broadening character, thus enhancing effective interaction bandwidth and thus system performance. This aspect is consistent with the one methodology presented here of common amplification of a number of lines for pumping of distinct isotopologues—or a unitary isotopologue on multiple rotational vibrational transitions of the $00^00\to 20^01$ combination band.

The preceding approaches are deficient in that they do not identify that one of the probable metastable levels likely to be populated post and during the optical pump of the $20^01$ band is the $01^11$ level of similar lifetime to the $00^01$ level. Lasing from this level on the transition(s) $01^11\to 11^10$ and $01^11\to 03^10$ will display twice as many lines as to be found in the traditional $00^01\to 10^00$ and $00^01\to 02^00$ transition(s)—this a result of elimination of double degeneracy present for zero angular momentum case, and resulting in continuous tunability of system at half the pressure required for zero angular momentum excited level $CO_2$.

The preceding approaches are deficient in that optically pumped raised pressure multi $CO_2$ isotopologue, symmetric and asymmetric, gas mix operation is not identified as a solution to the specific applications of remote sensing and sub picosecond pulse amplification courtesy of the impressively broad, and reproducible, spectrally contiguous gain spectrum resulting therefrom. This enhanced by probable $01^11$ metastable contribution under appropriate conditions. Optical pumping has the added benefit, if applied appropriately, of not driving significant dissociation in gas and thus can preserve and sustain predefined gas premixes.

Traditional discharge, radio frequency (RF) or e-beam pumping is deficient for a number of interrelated issues. Firstly, they are generally associated with dissociation of the gas mix, and thus require catalyzers for gas recovery. In the case of RF it is restricted to low pressure $CO_2$ operation and is thus only sensible within the Continuous Wave (CW) or quasi CW operational regime. Real gain switched energy/power is not feasible. In the case of high pressure operation only transverse discharge or e-beam applications are sensible in any way; however the discharge voltage, switching requirements and pulse forming network strictures render this difficult and impractical in most applications and reliability is typically a serious issue. This kind of high voltage/high current switching also carries with it the requirement for high voltage supplies and electro magnetic interference (EMI), which are derived from the high voltage/high current discharge events.

SUMMARY OF THE INVENTION

The present invention and its enabling feature is a laser diode excited, Thulium (Tm) doped solid state system directly optically pumping the $00^00 \rightarrow 20^01$ combination band transition of $CO_2$. The Tm doped solid state system may be pulsed or Continuous Wave (CW). $CO_2$ is the gas lasing material. As at the primary electrical interface the system is laser diode pumped the electronic system issues are low voltage and switching. Low voltage is easily and efficiently switched even at high currents. Given the optically pump enabled sustainability of multi $CO_2$ isotopologue (symmetric and asymmetric) active gas mixes this would admit, at raised pressure, a system with continuously tunable output from ~9 μm to ~11.5 μm (indeed to ~12 μm given the $01^11 \rightarrow 11^10$ transition). CW or pulsed operation is permitted (FIG. 1 and FIG. 2). The laser diode pumped Tm solid state system is spectrally ideally matched to the $00^00 \rightarrow 20^01$ $CO_2$ transition. Those $CO_2$ isotopologues not directly pumped would be collisionally pumped by rapid near resonant $v \leftrightarrow v$ excitation exchange interactions. Matching of pump mode volume to that of $CO_2$ mode volume will optimize efficiency and maximize volumetric extraction feasible. Catalyzer free system operation under appropriate pump conditions is expected.

It is therefore the object of the present invention to provide a directly optically pumped ~9 μm to ~11.5 μm $CO_2$ laser (amplifier) concept which overcomes the shortcomings of prior art devices and makes it practical to use in remote sensing and sub picosecond pulse amplification applications.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 3: Is an example of an induced multi-isotopologue gain spectrum at 5 atms for an arbitrary pre-mix. This, excluding transition contributions from the anticipated $01^11$ metastable level which would serve to smooth and further broaden the gain spectrum.

DETAILED DESCRIPTION OF INVENTION

Figure 1:
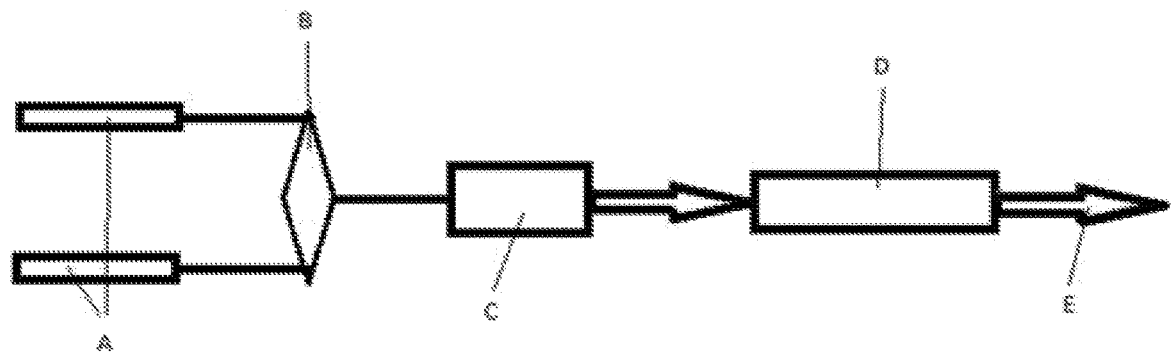
FIG. 1: Is an illustration of the pulsed manifestation of the invention. The $CO_2$ laser cavity is comprised of a resonant cavity for $CO_2$ optical radiation plus a containment structure for the $CO_2$ gas mix. The cavity axis conforms to the indicated 10 μm beam output direction (E), and thus the one-dimensional resonant cavity characteristic of lasers requiring resonant cavities. One or more synchronized pulsed oscillators, individually tuned and locked onto selected $CO_2$ isotopologue(s) pump transitions ($00^00 \rightarrow 20^01$) (A). Output via spectral beam combiner (B) (or any other beam combiner if required) into amplifier (C). Amplifier output, or by definition pump beam, via spectral beam combiner (or dichroic optics) to admit introduction to $CO_2$ laser cavity (D) with ~10 μm output (E).

Laser diode excited Thulium (Tm) doped solid state system component (FIG. 1. A, B, C & FIG. 2. A, B, C). Both pulsed and continuous wave (CW) operation is feasible. In pulsed case extractions of ~4 kJ/liter is achievable, enabling a compact related system. Ceramic host structures have been formed, admitting arbitrary shaping and sizing of Tm:host (host being any suitable glass or crystalline host, YAG being just one example) and thus energy and or power scaling. Operation is quasi 4 level, thus pulsed efficiency, optical out to optical absorbed, in excess of 40% is in principle achievable. In CW case, slope efficiencies approaching 80% is feasible, with single frequency operation at ~1 kW, without any indication of onset of stimulated Brillouin scattering limiting. Tuning spectral range can extend from 1.74 μm to 2.017 μm. The $CO_2$ $00^00 \rightarrow 20^01$ pump transitions for the isotopologues $^{12}C^{16}O_2$, $^{13}C^{16}O_2$, $^{12}C^{18}O_2$, $^{13}C^{18}O_2$, $^{16}O^{12}O^{18}O$ and $^{16}O^{13}C^{18}O$ are found to spectrally range from ~1.949 μm to 2.035 μm. There is thus significant overlap and hence pump access.

The laser diode excited Tm doped solid state optical pump approach to $CO_2$ is absent the high voltage switching, discharge electrode erosion, resulting in limited time between scheduled maintenance, and electromagnetic interference (EMI) issues of traditional pulse discharge, significantly gain switched, $CO_2$ lasers. In addition, it can readily access the high pressure $CO_2$ operational regime desirable in certain applications.

There are a variety of photonic and collisionally mediated interactions which have the capability of rapidly transitioning population from the pump terminal level to either, or both, the $00^01$ and $01^11$ metastable lasing levels. The $01^11$ level presents with a strong Q branch transition (~15.3 μm) to the $00^01$ level should such be desirable. This may, by design be encouraged or discouraged. The non-zero angular momentum metastable level is desirable for specific applications as it presents with twice the transition lines of the zero angular momentum symmetric isotopologue case and thus will be continuously tunable at a pressure below that required for the symmetric isotopologue zero angular momentum metastable level.

Optical pumping, absent the significant dissociation and catalyzer driven recombination as required in most competitive discharge pumped $CO_2$ systems, admits arbitrary sustainable use of predetermined $CO_2$ isotopologue (symmetric and asymmetric) mixes. For example, in a discharge driven system with catalyzer one can use a mix of $^{12}C^{16}O_2 + ^{13}C^{16}O_2$, but not of $^{12}C^{16}O_2 + ^{12}C^{18}O_2$ or $^{12}C^{16}O_2 + ^{13}C^{18}O_2$, as mixture will in time corrupt to $^{12}C^{16}O_2 + ^{12}C^{18}O_2 + ^{18}O^{12}C^{16}O$ and $^{12}C^{16}O_2 + ^{13}C^{18}O_2 + ^{18}C^{12}C^{16}O + ^{18}O^{13}C^{16}O$. In the case of appropriate optical pumping, as indicated, a desirable arbitrary premix of these gases can be implemented and will be largely preserved in use.

Continuous tunability deriving from an appropriate gas premix, pressure and optical pumping is expected for example then to present with a sustainable gain spectral distribution of the form FIG. 3.

The following is a description of the best mode contemplated by the inventor of the laser diode excited solid state optically pumped $CO_2$ system. A laser diode excited Tm solid state pulsed laser, frequency(s) locked on desired $CO_2$ isotopologue(s) combination band(s) ($00^00 \rightarrow 20^01$) (FIG. 1. A, B, C), seed oscillators synchronized, output coupled as input into $CO_2$ cavity region and mode matched to related $CO_2$ cavity determined lasing volume (FIG. 1. D). Laser plus amplifier combination possibly amplifying more than one pump transition frequency as indicated in FIG. 1A, B, C.

Figure 2:
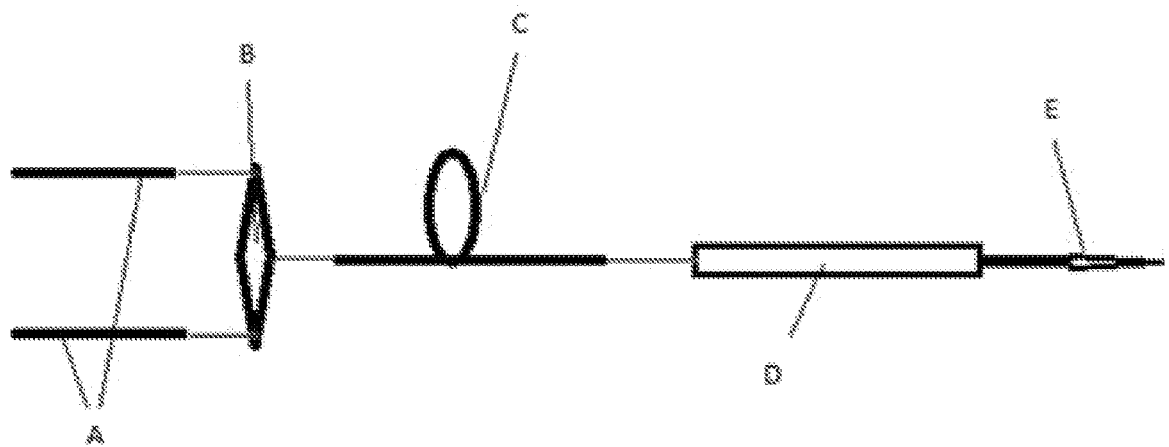
FIG. 2: Is an illustration of the CW manifestation of the invention. The $CO_2$ laser cavity is comprised of a resonant cavity for $CO_2$ optical radiation plus a containment structure for the $CO_2$ gas mix. The cavity axis conforms to the 10 μm beam output direction (E), and thus the one-dimensional resonant cavity characteristic of lasers requiring resonant cavities. One or more CW or synchronized quasi CW fiber oscillators, tuned and locked individually to selected $CO_2$ isotopologue(s) pump transitions ($00^00 \rightarrow 20^01$) (A). Output via suitable beam combiner (B) into fiber amplifier (C). Amplifier output, or by definition pump beam, via suitable beam combiner or dichroic optics, into $CO_2$ laser cavity (D) with ~10 μm output (E).

The following is a description of an alternate embodiment contemplated by the inventor of the laser diode excited solid state optically pumped $CO_2$ system. A laser diode excited Tm solid state CW laser, frequency(s) locked on desired $CO_2$ isotopologue(s) combination band(s) ($00^00 \rightarrow 20^01$) (FIG. 2. A, B, C), output coupled as input into $CO_2$ cavity region and mode matched to related $CO_2$ cavity determined lasing volume (FIG. 2. D). Laser plus amplifier combination possibly amplifying more than one pump transition frequency as indicated in FIG. 2. A, B, C.

At high pressure, $00^00 \rightarrow 20^01$ pump transition bandwidth is sufficiently large to admit sufficiently broad solid state system bandwidth for efficient operation. At reduced pressure and for pump events under several hundred nanoseconds, for a single $CO_2$ isotopologue pumped on several selected rotational vibrational lines of the $00^00 \rightarrow 20^01$ transition, the interaction will yield adequate solid state interaction bandwidth for efficient operation. Similarly at reduced pressure but with several $CO_2$ isotopologues pumped on selected rotational vibrational transitions of their respective $00^00 \rightarrow 20^01$ transitions the solid state interaction bandwidth will be adequate for efficient operation.

Coupling, or combination, of ~2 μm with ~10 μm cavity axis and mode volume via either dispersion in prisms or dichroic optics (FIG. 1. D & FIG. 2. D). Prisms cut with apex angle such that surface interactions are on Brewster angle for $CO_2$ wavelength range, and near Brewster for ~2 μm pump. Prism material ideally low index as such typically reduces losses attributable to slight angular offsets.

Single or multi $CO_2$ isotopologue gas mix situations are equally desirable from a system standpoint. Selection of gas mix and pressure to be utilized a function of intended application; high pressure and continuously tunable, near atmospheric or modest sub atmospheric and line tunable.

In pulsed high power optically pumped applications significantly sub atmospheric pressure not desirable as due to notably reduced relaxation rates alternate high gain transitions are not suppressed by excitation relaxation into the $00^01$ and $01^11$ levels, other than should those specific transitions be desired which amongst others include a band from 4.2 μm to 4.3 μm and a structure at ~15.26 μm. In some of the latter cases a resonant cavity is not necessarily required as gain is sufficiently high to result in amplified spontaneous emission.

Utilization of atmospheric, or higher, pressure non pumped low gain $CO_2$ gas cells intra cavity (FIG. 1. D & FIG. 2. D) if required to suppress ~4.2 μm to 4.3 μm and ~15.26 μm transitions is permitted. Low gain denotes spectrally selective absorption.

In a multi isotopologue gas mix, pumping of several isotopologues is preferable to pumping only one. At significant pressure this is less relevant as rate of cross relaxation to neighboring isotopologues increases.

Gas flow for thermal management at power, in reduced power applications diffusion cooling to waveguide or containment structure acceptable.

$CO_2$ cavity optics commensurate with intended application. Tunable if continuous or line tunability required, otherwise simple broadband (FIG. 1. D & FIG. 2. D).

Intra $CO_2$ cavity preferred use of transmitting optics (windows) at Brewster angle as this is favorable from a surface fluence reduction standpoint, plus minimizes Fresnel losses at ~2 μm and ~10 μm without need for dual wavelength anti reflection coatings (FIG. 1. D & FIG. 2. D).

The $CO_2$ cavity isotopologue(s) may be admixed with at least one, or more, buffer gases selected from the group consisting of Helium, Argon and Nitrogen.

This laser diode excited, solid state pumped $CO_2$ presents with a number of capabilities deriving from its particular features. Specifically, it is well suited to remote sensing applications requiring line or continuous tunability from ~9 μm through and above 11.5 μm. Similarly, at pressure, it is suited to utilization as a broadband amplifier for sub picosecond pulse amplification and for high energy high power pulsed, or other applications requiring high energy pulsed output, disruption of thermal imaging systems of various types. Finally, utilization as a simple non tuned pulsed laser for industrial applications benefits from the methodologies general non dependence on an internal catalyzer for any meaningful gas lifetime.

The forgoing description of the invention has been presented for purposes of illustration and description and is not intended to be exhaustive or to limit the invention to the precise form disclosed. Many modifications and variations are possible in the light of the above teaching. The embodiments disclosed were meant only to explain the principles of the invention and its practical application to thereby enable others skilled in the art to best use the invention in various embodiments and with various modifications suited to the particular use contemplated.

What is claimed is:

1. An optically pumped $CO_2$ laser comprising, a laser diode excited Tm solid state laser tuned to the $00^00 \rightarrow 20^01$ combination band transition(s) of $CO_2$ isotopologue(s) to be optically pumped for lasing purposes;

a gas containment structure with selected $CO_2$ gas mix and admixture gas components and at pressure for line tunability or continuous tunability, located internal to a resonant cavity; a pump beam and, a $CO_2$ cavity axis combination method imposing pump beam $CO_2$ gas interaction; the $CO_2$ laser producing an output in an atmospheric optical transmission window within a spectral region from approximately 9 μm to approximately 11.5 μm.

2. An optically pumped $CO_2$ laser, according to claim 1, wherein for the optically pumped $CO_2$ at pressure, a laser diode pumped solid state system's efficiency is not limited by molecular line widths and at reduced pressure, where molecular lines resolve individually, multiple rotational vibrational transitions may be pumped thus broadening solid state system interaction bandwidth sufficiently for efficient extraction, achievable with a single or multi isotopologue $CO_2$ gas mix.

3. An optically pumped $CO_2$ laser, according to claim 1, wherein the optically pumped $CO_2$ metastable levels accessible for lasing in the defined approximately 9 μm to approximately 11.5 μm range include the $00^01$ and $01^11$ levels.

4. An optically pumped $CO_2$ laser, according to claim 1, wherein a Tm solid state pump laser may be CW or pulsed and thus the optically pumped $CO_2$ lasing may be CW or pulsed.

5. An optically pumped $CO_2$ laser, according to claim 1, wherein a $CO_2$ cavity admits utilization of atmospheric, or higher, pressure non pumped low gain gas cells intra cavity to suppress the approximately 4.2 μm to 4.3 μm and the approximately 15.26 μm transitions.

6. An optically pumped $CO_2$ laser, according to claim 1, wherein in the absence of dissociation a catalyzer is not a system requirement.

7. An optically pumped $CO_2$ laser, according to claim 1, wherein a $CO_2$ cavity's isotopologue(s) may be admixed with one, or more buffer gases selected from the group consisting of Helium, Argon and Nitrogen.

8. An optically pumped $CO_2$ laser, according to claim 1, wherein the pumped $CO_2$ is absent chemical reaction sourced optical pumping, and thus is absent related precursor or product gas handling issues plus any efficiency shortfall attributable to line mismatches.

9. An optically pumped $CO_2$ laser comprising, a sustained and preserved single or multi-$CO_2$ isotopologue mix, the mix having symmetric and asymmetric components, the mix capability courtesy of absence of gas mix perturbation by molecular dissociation driven recombination.

10. An optically pumped $CO_2$ laser according to claim 9, wherein a $CO_2$ cavity, absent said molecular dissociation, allows utilization of an arbitrarily proportioned multi isotopologue $CO_2$ gas mix, with an optimal line tunability from approximately 9 μm through approximately 11.5 μm at atmospheric or modest sub atmospheric pressure, and continuous tunability from approximately 9 μm through approximately 11.5 μm at high pressure.

11. An optically pumped $CO_2$ laser, according to claim 9, wherein the optically pumped $CO_2$ laser is used in, given spectral tunability, a system for remote sensing of agents of interest in the approximately 9 μm to approximately 11.5 μm spectral range.

12. An optically pumped $CO_2$ laser, according to claim 9, wherein at a pressure a system is enabled which is suitable for use for short pulse amplification of approximately 10 μm $CO_2$ laser output into the sub_picosecond timescale.

13. An optically pumped $CO_2$ laser, according to claim 9, wherein using the feasibility of utilization of asymmetric isotopologues and/or a $01^11$ excited level, a-system gas pressure required for continuous tunability is 50% or less than that required for the purely symmetric isotopologues.

14. An optically pumped $CO_2$ laser, according to claim 9, wherein absent the molecular dissociation, a catalyzer is not a system requirement.

* * * * *